(12) United States Patent
Takahashi et al.

(10) Patent No.: US 10,156,351 B2
(45) Date of Patent: Dec. 18, 2018

(54) TEMPERATURE CONTROL DEVICE, IMAGE DISPLAY APPARATUS AND VEHICLE

(71) Applicants: Masafumi Takahashi, Kanagawa (JP); Naoyuki Yamashita, Kanagawa (JP)

(72) Inventors: Masafumi Takahashi, Kanagawa (JP); Naoyuki Yamashita, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 103 days.

(21) Appl. No.: 15/056,174

(22) Filed: Feb. 29, 2016

(65) Prior Publication Data

US 2016/0258611 A1    Sep. 8, 2016

(30) Foreign Application Priority Data

Mar. 6, 2015   (JP) .................................. 2015-044569

(51) Int. Cl.
*F21V 29/54*        (2015.01)
*H01S 5/02*         (2006.01)
(Continued)

(52) U.S. Cl.
CPC ................ *F21V 29/54* (2015.01); *B60R 1/00* (2013.01); *F21V 29/70* (2015.01);
(Continued)

(58) Field of Classification Search
CPC .... G02B 2027/0112; G02B 2027/0196; G02B 2029/0127
(Continued)

(56) References Cited

U.S. PATENT DOCUMENTS 6,971,750 B1 *  12/2005  Inoue ..................... G03B 21/10
                                                     345/84
9,041,818 B2    5/2015   Takahashi et al.
(Continued)

FOREIGN PATENT DOCUMENTS

EP        2784577 A1    10/2014
JP       2014-095796     5/2014
(Continued)

OTHER PUBLICATIONS

European search report dated Jul. 15, 2016 in corresponding European Patent Application No. 16158170.7.

*Primary Examiner* — Steven H Whitesell Gordon
*Assistant Examiner* — Jerry Brooks
(74) *Attorney, Agent, or Firm* — Cooper & Dunham LLP (57)           ABSTRACT

A temperature control device includes a first light source unit; a second light source unit, a temperature control effort for which is different from a temperature control effort for the first light source unit; a heat exchanger plate in contact with the first light source unit and the second light source unit; a single temperature control element configured to control temperature of the first light source unit and temperature of the second light source unit via the heat exchanger plate; and a thermal resistance adjustment part configured to adjust at least one of a value of a thermal resistance between the temperature control element and the first light source unit and a value of a thermal resistance between the temperature control element and the second light source unit.

20 Claims, 7 Drawing Sheets

(51) Int. Cl.
  *F21V 29/70* (2015.01)
  *B60R 1/00* (2006.01)
  *G02B 27/01* (2006.01)
  *G06T 19/00* (2011.01)
  *H04N 9/31* (2006.01)
  *H01S 5/022* (2006.01)
  *H01S 5/024* (2006.01)
  *H01S 5/40* (2006.01)

(52) U.S. Cl.
  CPC ........ G02B 27/0101 (2013.01); G06T 19/006 (2013.01); H01S 5/02 (2013.01); H01S 5/02469 (2013.01); H04N 9/3144 (2013.01); H04N 9/3188 (2013.01); *G02B 2027/0112* (2013.01); *G02B 2027/0127* (2013.01); *G02B 2027/0196* (2013.01); *H01S 5/02212* (2013.01); *H01S 5/02415* (2013.01); *H01S 5/4012* (2013.01); *H01S 5/4093* (2013.01)

(58) Field of Classification Search
  USPC ...................................... 353/94, 52
  See application file for complete search history.

(56) References Cited

U.S. PATENT DOCUMENTS

| | | | |
|---|---|---|---|
| 2010/0290011 A1* | 11/2010 | Chen | G03B 21/16 353/61 |
| 2010/0302513 A1* | 12/2010 | Takahashi | G03B 33/12 353/33 |
| 2012/0327379 A1* | 12/2012 | Enomoto | G03B 21/16 353/52 |
| 2013/0242265 A1* | 9/2013 | Kato | G03B 21/16 353/31 |
| 2014/0159077 A1 | 6/2014 | Kuenzler | |
| 2014/0293235 A1* | 10/2014 | Azuma | G03B 21/147 353/31 |
| 2014/0293239 A1 | 10/2014 | Shimizu et al. | |
| 2014/0293430 A1 | 10/2014 | Takahashi | |
| 2015/0146392 A1 | 5/2015 | Yamashita | |

FOREIGN PATENT DOCUMENTS

| JP | 2014-194501 | 10/2014 |
| JP | 2014-195218 | 10/2014 |
| JP | 20166444 | 1/2016 |

* cited by examiner

TEMPERATURE CONTROL DEVICE, IMAGE DISPLAY APPARATUS AND VEHICLE

CROSS-REFERENCE TO RELATED APPLICATIONS

The present application claims benefit of priority under 35 U.S.C. § 119 of Japanese Patent Application No. 2015-044569, filed Mar. 6, 2015. The contents of this application are incorporated herein by reference in their entirety.

BACKGROUND OF THE INVENTION

1. Field of the Invention

The disclosures herein generally relate to a temperature control device, an image display apparatus and a vehicle.

2. Description of the Related Art

Recently, market expectations for applications, by which drivers can recognize warnings and information with small sight line movement, have increased, and technology developments for head-up displays (HuD) installed on vehicles have been advanced. Especially, with the progress of on-vehicle sensing technologies, represented by the term ADAS (Advanced Driving Assistance System), vehicles have become able to capture information on travelling environments and occupants in vehicles. Then, the HuD has received attention as an "exit of ADAS" for transmitting the information to drivers.

As a projection system of the HuD, a "panel system" for expressing an intermediate image with an imaging device, such as a liquid crystal device or a digital mirror device (DMD), has been known. Moreover, there is a "laser scanning system" for scanning with laser beams emitted from laser diodes (in the following, referred to as "LD") with a two-dimensional scanning device to form an intermediate image.

Especially, in the laser scanning system, in the latter case, different from the panel system in which an image is formed by partially shielding light from an entire screen emission, because it is possible to assign emission/not emission for each pixel, an image with high contrast can be formed. However, the laser diode has temperature dependency, and in a case of use in a high-temperature environment or in low-temperature environment, it is necessary to carry out temperature control such as cooling or heating in order to maintain the temperature of the laser diode within an appropriate range. Then, a technology for assigning Peltier devices to respective laser diodes for RGB with different wavelengths, to control temperatures of the respective laser diodes has been proposed (for example, see Japanese Unexamined Patent Application Publication No. 2014-195218).

SUMMARY OF THE INVENTION

It is an object of an embodiment of the present invention to provide a temperature control device, an image display apparatus and a vehicle that substantially obviate one or more problems caused by the limitations and disadvantages of the related art.

In the embodiment, a temperature control device includes a first light source unit; a second light source unit, a temperature control effort for which is different from a temperature control effort for the first light source unit; a heat exchanger plate in contact with the first light source unit and the second light source unit; a single temperature control element configured to control temperature of the first light source unit and temperature of the second light source unit via the heat exchanger plate; and a thermal resistance adjustment part configured to adjust at least one of a value of a thermal resistance between the temperature control element and the first light source unit and a value of a thermal resistance between the temperature control element and the second light source unit.

In a modification of the embodiment, an image display apparatus includes a temperature control device, which includes a first light source unit; a second light source unit, a temperature control effort for which is different from a temperature control effort for the first light source unit; a heat exchanger plate in contact with the first light source unit and the second light source unit; a single temperature control element configured to control temperature of the first light source unit and temperature of the second light source unit via the heat exchanger plate; and a thermal resistance adjustment part configured to adjust at least one of a value of a thermal resistance between the temperature control element and the first light source unit and a value of a thermal resistance between the temperature control element and the second light source unit.

In yet another modification of the embodiment, an image display apparatus is installed in a vehicle. The image display apparatus includes a temperature control device, which includes a first light source unit; a second light source unit, a temperature control effort for which is different from a temperature control effort for the first light source unit; a heat exchanger plate in contact with the first light source unit and the second light source unit; a single temperature control element configured to control temperature of the first light source unit and temperature of the second light source unit via the heat exchanger plate; and a thermal resistance adjustment part configured to adjust at least one of a value of a thermal resistance between the temperature control element and the first light source unit and a value of a thermal resistance between the temperature control element and the second light source unit. The image display apparatus further includes a light deflector configured to deflect a light flux into which light fluxes emitted from the first to third light source units are synthesized, and form a two-dimensional image on a surface to be scanned; a semi-transmissive mirror configured to transmit a part of visible light and reflect another part of the visible light on a reflection surface; and a projection optical system configured to project the two-dimensional image onto the reflection surface of the semi-transmissive mirror. An enlarged virtual image of the two-dimensional image, which is viewable by a driver, is formed at a predetermined position beyond the reflection surface of the semi-transmissive mirror.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

In the following, an embodiment of the present invention will be described with reference to the accompanying drawings. In each drawing, to the same configuration part, the same reference numeral is assigned, and duplicate explanation may be omitted.

<First Embodiment>

(Image Display Apparatus)

In a first embodiment, application of an image display apparatus to an HuD installed on a vehicle (car) will be explained. The HuD is an apparatus, which is installed on a movable body, such as a car, an airplane, a ship or the like, and makes navigation information (e.g. information such as a velocity or a travel distance) or the like necessary for driving the movable body visible via a front windshield or the like of the movable body.

Figure 1A:
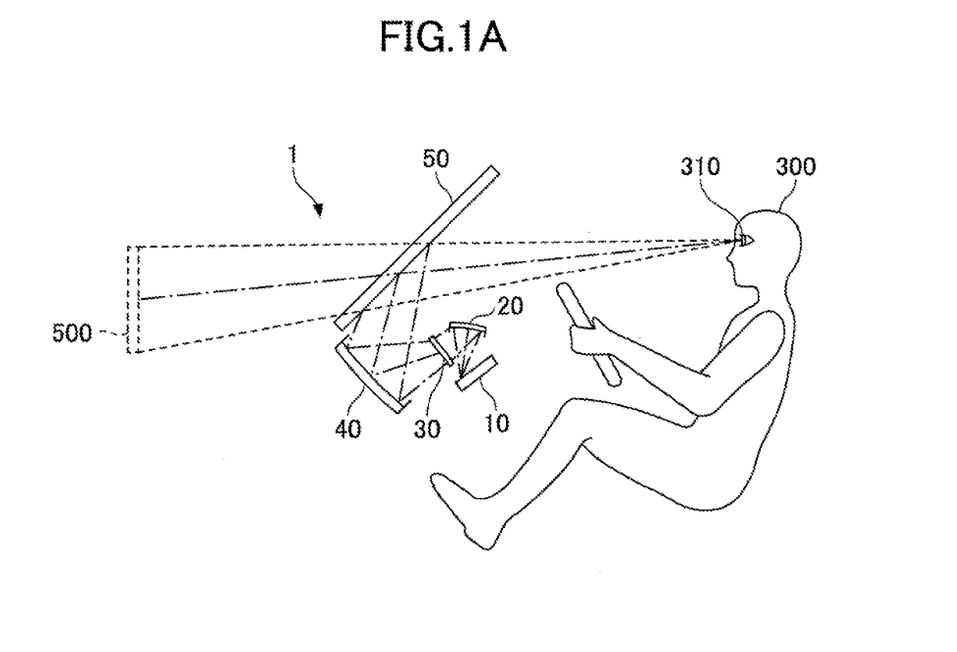
FIGS. 1A and 1B are diagrams illustrating an example of a configuration of an image display apparatus according to a first embodiment.
Figure 1B:
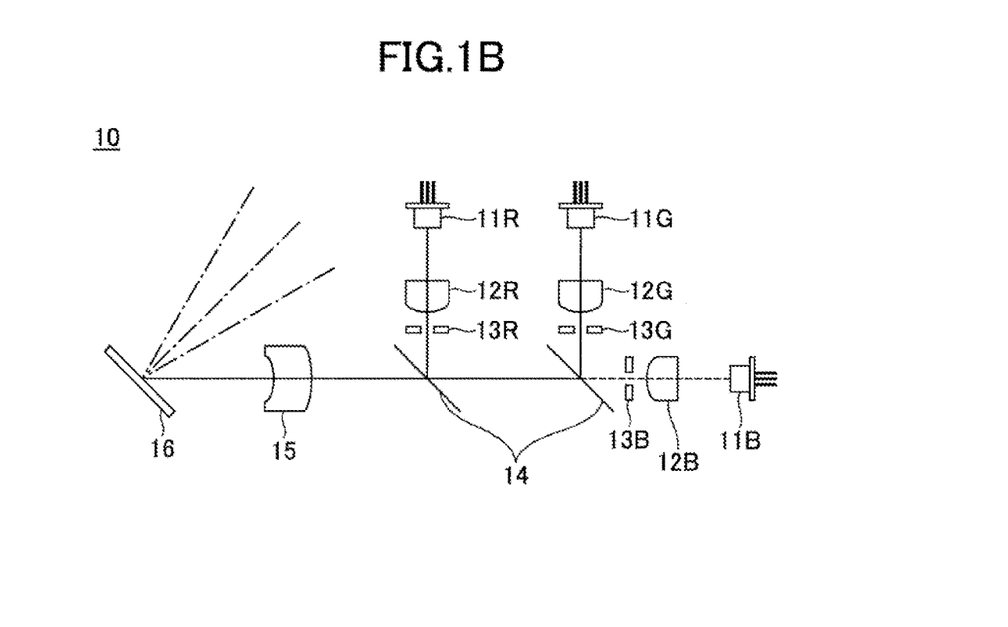

FIGS. 1A and 1B are diagrams illustrating a configuration of the image display apparatus according to the first embodiment. FIG. 1A illustrates an overall configuration of the image display apparatus 1, and FIG. 1B illustrates a configuration of a light scanning unit 10 of the image display apparatus 1.

As shown in FIG. 1A, the image display apparatus 1 includes the light scanning unit 10, a scanning mirror 20, a surface to be scanned 30 and a reflection mirror 40. In the image display apparatus 1, the front windshield 50 of the vehicle is irradiated with light, so that a virtual image 500 is visible from eyes 310 of a driver 300.

As shown in FIG. 1B, the light scanning unit 10 includes light-emitting elements 11R, 11G and 11B, coupling lenses 12R, 12G and 12B, apertures 13R, 13G and 13B, a synthetic element 14, a lens 15 and a light deflector 16.

In the light scanning unit 10, the light-emitting elements 11R, 11G and 11B can emit light fluxes with wavelengths 1R, 1G and 1B (not shown), respectively, which are different from each other. The wavelengths 1R, 1G and 1B may be, for example, 640 nm, 530 nm and 445 nm, respectively. For the light-emitting elements 11F, 11G and 11B, for example, lasers, LEDs (Light Emitting Diodes) or SHD (Second Harmonic Generation) elements may be employed.

From a viewpoint of enabling miniaturization while maintaining brightness or high image quality, semiconductor lasers are preferably used for the light-emitting elements 11R, 11G and 11B. Emission power, emission timing or the like of the light-emitting elements 11R, 11G and 11B is controlled by a control means. Meanwhile, the control means may be arranged inside the light scanning unit 10 or may be arranged outside the light scanning unit 10.

The light fluxes (divergent light) emitted from the light-emitting elements 11R, 11G and 11B, in response to a content of an image signal, are converted into approximately parallel light or convergent light in the coupling lenses 12R, 12G and 12B, respectively, and are transmitted to the respective apertures 13R, 13G and 13B. As the coupling lenses 12R, 12G and 12B, for example, convex glass lenses or plastic lenses may be used.

Each of the apertures 13R, 13G and 13B has a function of shaping a transmitted light flux. Each of the apertures 13R, 13G and 13B may have various shapes, such as a circle, an oval, a rectangle or a square, in response to a divergence angle or the like of the transmitted light flux.

The light flux shaped in each of the apertures 13R, 13G and 13B is transmitted to the synthetic element 14. Because the synthetic element 14 has a function of reflecting or transmitting the respective light fluxes in response to the wavelengths, and synthesizing into a light path as a light flux, three kinds of light fluxes having the wavelengths 1R, 1G and 1B are synthesized into a light path as a light flux. The synthetic element 14 may be a dichroic mirror having a plurality of plates.

The light deflector 16 deflects the light flux after being synthesized in the synthetic element 14, and forms a two-dimensional image on the surface to be scanned. Specifically, the light flux, which is synthesized into a light path as a light flux in the synthetic element 14, is guided toward a reflection surface of the light deflector 16 by the lens 15. As the lens 15, for example, a single meniscus lens or the like which is arranged so that a concave surface is directed to the light deflector 16 may be used.

The light flux, guided to the reflection surface of the light deflector 16, is deflected two-dimensionally by the light deflector 16. As the light deflector 16, for example, a small mirror which swings around two axles, or two small mirrors which swing or turn around an axle may be used. The light deflector 16 may be, for example, a microelectromechanical system (MEMS) prepared in a semiconductor process or the like. The light deflector 16 may be driven by, for example, an actuator, a driving force of which is a deformation force of a piezoelectric element.

Returning to FIG. 1A, the light flux deflected two-dimensionally by the light deflector 16 is transmitted to the scanning mirror 20, is reflected by the scanning mirror 20 and creates a two-dimensional image (intermediate image) on the surface to be scanned 30.

The surface to be scanned 30 is a transmissive surface to which the light flux reflected by the scanning mirror 20 is transmitted and on which a two-dimensional image is formed. The surface to be scanned 30 has a function of causing the transmitted light flux to diverge with a desired divergence angle. The surface to be scanned 30 may have, for example, a micro lens array structure. As the surface to be scanned, a diffuser panel may be used.

The light flux transmitted from the surface to be scanned 30 is reflected on the reflection mirror 40 and transmitted to the front windshield 50. That is, the two-dimensional image formed on the surface to be scanned 30 is projected onto a reflection surface (a surface on a side of the driver 300) of the front windshield 50. As the reflection mirror 40, for example, a single concave surface mirror may be used. The reflection mirror 40 is preferably designed and arranged so as to correct an optical distortion element in which a horizontal line of an intermediate image has a convex shape upward or downward due to an influence of the front windshield 50. Meanwhile, the reflection mirror 40 is a typical example of a projection optical system according to the present embodiment.

The front windshield 50 is a semi-transmissive mirror that transmits a part of visible light and reflects a part of visible light. A part of the light flux entering the front windshield 50 is reflected on the front windshield 50 and enters the eye 310 of the driver 300 in a driver's seat. According to the above-described configuration, the driver 300 can view a virtual image 500, which is obtained by enlarging a two-dimensional image on the surface to be scanned 30, at a predetermined position (opposite surface side to the reflection surface of the front windshield 50) beyond the front windshield 50. Meanwhile, a semi-transmissive mirror (combiner) having the same function (partial reflection) as the front windshield 50 may be provided separately.

(Temperature Control Device)

Figure 2:
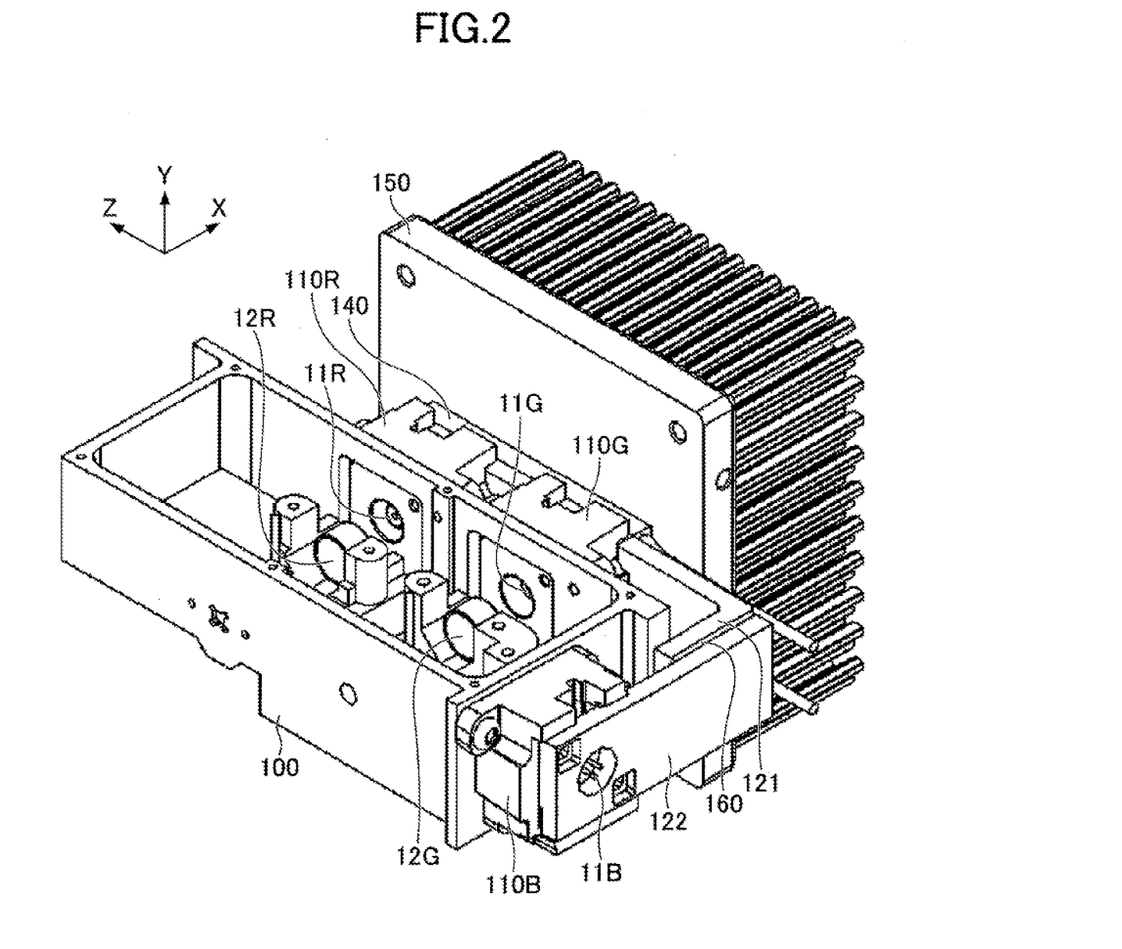
FIG. 2 is a perspective view illustrating an example of a structure adjacent to a light scanning unit according to the first embodiment.
Figure 3:
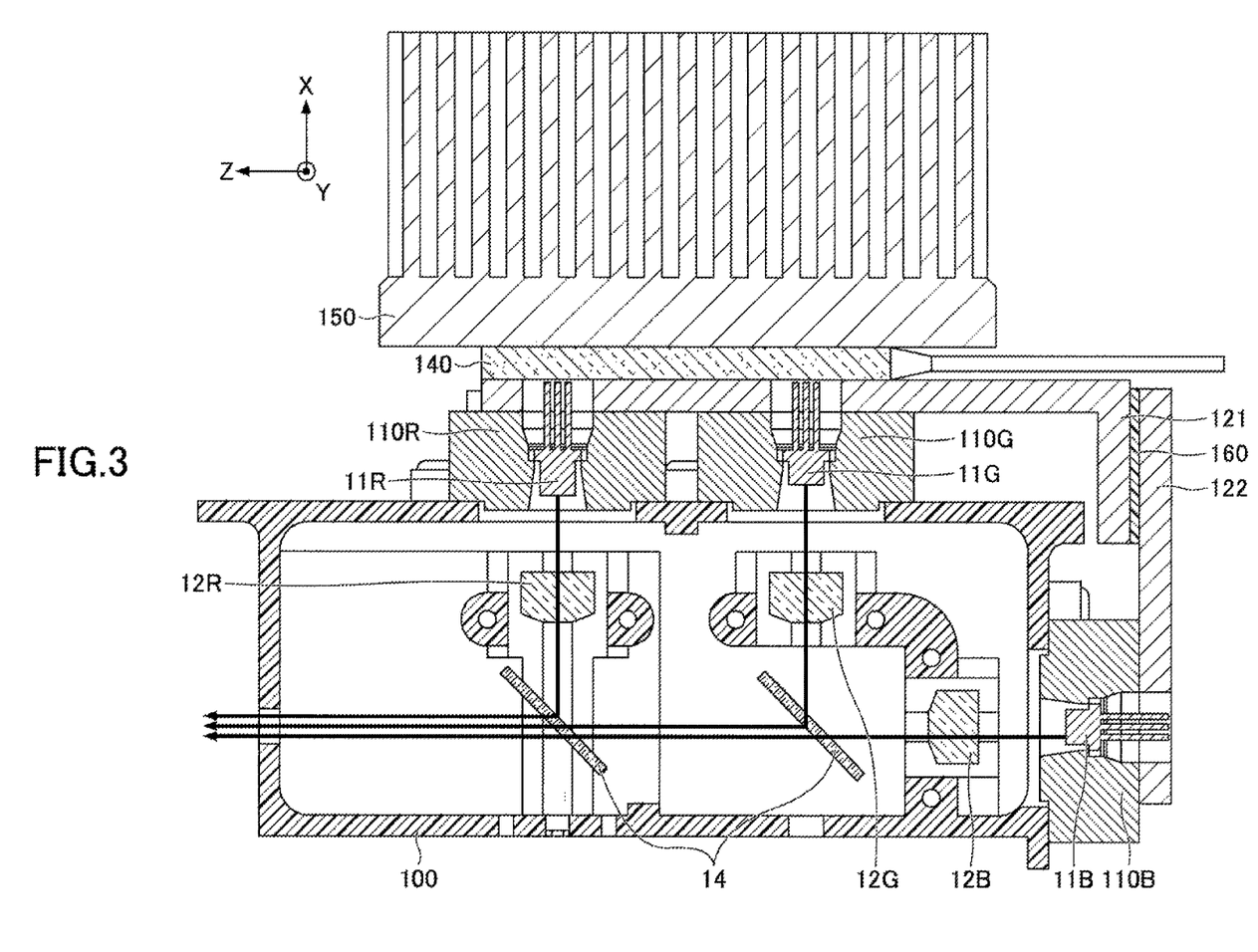
FIG. 3 is a transverse cross-sectional view illustrating an example of the structure adjacent to the light scanning unit according to the first embodiment.

Next, a temperature control for the light-emitting elements 11R, 11G and 11B in the image display apparatus 1 will be described. FIG. 2 is a perspective view illustrating a structure adjacent to the light scanning unit according to the first embodiment. FIG. 3 is a transverse cross-sectional view (X-Z cross-sectional view) illustrating a structure adjacent to the light scanning unit according to the first embodiment. Meanwhile, illustration of the apertures 13R, 13G, and 13B, shown in FIG. 1, is omitted.

As shown in FIGS. 2 and 3, the light-emitting elements 11R, 11G and 11B are pressed into holders 110R, 110G and 110B, respectively. The holders 110R, 110G and 110B may be made of a material having great thermal conductivity, such as aluminum or copper. Positions of the holders 110R, 110G and 110B are adjusted in a direction orthogonal to the respective optical axes in order to perform an optical axis adjustment, and then the holders 110R, 110G and 110B are fixed to a housing 100.

For example, a biaxial adjustment in the Y-Z direction is performed for the light-emitting elements 11R and 11G, and a biaxial adjustment in the X-Y direction is performed for the light-emitting element 11B. Then, the holders 110R, 110G and 110B are fixed to the housing 100 by using screws or adhesive agent. In order to avoid optical axis misalignment after the adjustment and fixation, the holders 110R, 110G and 110B are preferably placed so as not to be loaded (stressed) in the direction orthogonal to the optical axis (adjustment direction).

Meanwhile, the light-emitting element and the holder may be collectively named a light source unit. For example, the light-emitting element 11B and the holder 110B are a first light source unit, the light-emitting element 11G and the holder 110G are a second light source unit, and the light-emitting element 11R and the holder 110R are a third light source unit.

Incidentally, in a case of installing the image display apparatus 1 on a vehicle, an envisaged external environment temperature is, for example, from about −40° C. to +85° C. In contrast, an operation temperature range for laser is narrower than the envisaged external environment temperature. Therefore, in order to cause the light-emitting elements 11R, 11G and 11B to operate normally, it is necessary to carry out temperature control (heating or cooling), to cause temperatures of the respective light-emitting elements to fall within the operation temperature range. Then, in the image display apparatus 1, the temperature control for the light-emitting element 11R, 11G and 11B is performed by using heat exchanger plates 121, 122 and a Peltier device 140.

Specifically, a facing surface of the L-shaped heat exchanger plate 121 comes in contact with back surfaces of the holders 110R and 110G (a surface on the side opposite to an emission direction of the light-emitting element). Both members are fixed by using screws or the like. The heat exchanger plate 121 may be made of a material having great thermal conductivity, such as aluminum or copper. On a back surface of the heat exchanger plate 121, the Peltier device 140 that is a temperature control element is provided. Furthermore, on a side of the Peltier device 140 opposite to the heat exchanger plate 121, a heat sink 150 is provided. Meanwhile, the Peltier device 140 is preferably arranged adjacent to a central portion of the heat sink 150 in order to reduce a load.

It is possible to heat or cool the light-emitting element 11R by the Peltier device 140 via the holder 110R and the heat exchanger plate 121. Moreover, it is possible to heat or cool the light-emitting element 11G by the Peltier device 140 via the holder 110G and the heat exchanger plate 121.

A facing surface of the I-shaped heat exchanger plate 122 comes in contact with the back surface of the holder 110B. Both members are fixed by using screws or the like. The heat exchanger plate 122 may be made of a material having great thermal conductivity, such as aluminum or copper. An elastic member 160 is inserted between the heat exchanger plate 121 and the heat exchanger plate 122. The elastic member 160 may be made of, for example, a silicone thermally-conductive sheet, thermally-conductive grease or the like.

That is, two heat exchanger plates, i.e. the heat exchanger plate 121 and the heat exchanger plate 122, are thermally coupled to each other via the elastic member 160, to form a single L-shaped heat exchanger plate as a whole. Then, the holder 110R into which the light-emitting element 11R is pressed and the holder 110G into which the light-emitting element 11G is pressed come in contact with the inside of long sides of the single L-shaped heat exchanger plate (the heat exchanger plates 121 and 122), respectively. Moreover, the holder 110B into which the light-emitting element 11B is pressed comes in contact with the inside of a short side of the single L-shaped heat exchanger plate (the heat exchanger plates 121 and 122). Furthermore, the Peltier device 140 comes in contact with the outside of the long side of the single L-shaped heat exchanger plate (the heat exchanger plates 121 and 122).

According to the elastic member 160 inserted between the heat exchanger plate 121 and the heat exchanger plate 122, heat can be transferred from the heat exchanger plate 121 to the heat exchanger plate 122. Therefore, the light-emitting element 11B can be heated or cooled by the Peltier device 140 via the holder 110B, the heat exchanger plate 122, the elastic member 160 and the heat exchanger plate 121.

Moreover, according to the elastic member 160 inserted between the heat exchanger plate 121 and the heat exchanger plate 122, for example, even if one of the heat exchanger plate 121 and the heat exchanger plate 122 deforms due to a thermal expansion or the like, it is possible to avoid influence of the deformation to the other. Therefore, it becomes possible to suppress a load applied to each of the holders in the direction orthogonal to the optical axis occurring due to the influence from one of the heat exchanger plate 121 and the heat exchanger plate 122 to the other. As a result, an optical axis misalignment of each of the light-emitting elements can be reduced.

Incidentally, the temperature ranges of operation or amounts of heat generation for the light-emitting elements 11R, 11G and 11B, the wavelengths of which are different from each other, may be different from each other. In this case, temperature control effort (amounts of heat absorption or amounts of heat generation) required for the Peltier device 140 are different.

For example, for a light-emitting element having a narrow temperature range of operation on the high temperature side, because it is necessary to cool more than a light-emitting element having a wide temperature range of operation on the high temperature side, the temperature control effort by the Peltier device 140 becomes greater. Moreover, even when the temperature ranges of operation are the same, if the amounts of heat generation are different, a light-emitting element having a greater amount of heat generation is required to be cooled more than a light-emitting element having a smaller amount of heat generation, and the temperature control effort by the Peltier device 140 becomes greater.

Therefore, in order to control the temperatures of the light-emitting elements 11R, 11G and 11B in balance, in conformity with the temperature control effort required for the respective light-emitting elements, it is necessary to adjust thermal resistances between the Peltier device 140 and the light-emitting elements 11R, 11G and 11B. The above-described configuration will be further described with reference to FIG. 4.

Figure 4:
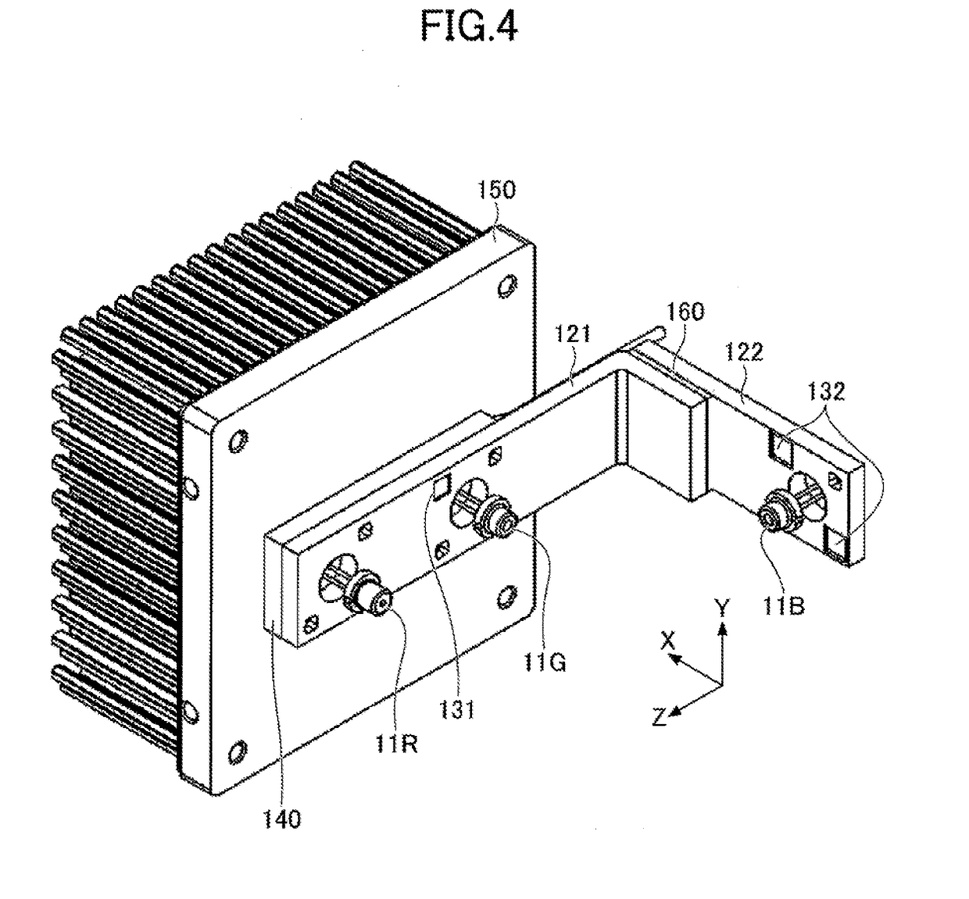
FIG. 4 is a perspective view illustrating an example of a structure adjacent to a heat exchanger plate according to the first embodiment.

FIG. 4 is a perspective view illustrating a structure adjacent to the heat exchanger plate according to the first embodiment. As shown in FIG. 4, the heat exchanger plate 121 is provided with a groove 131 on the surface facing the holder 110G (see FIGS. 2 and 3). By adjusting a size of the groove 131, to cause an abutting area (contact area) between the holder 110G and the heat exchanger plate 121 to have an appropriate value, the thermal resistance between the Peltier device 140 and the light-emitting element 11G can be adjusted.

Similarly, the heat exchanger plate 122 is provided with grooves 132 (two places) on the surface facing the holder 110B (see FIGS. 2 and 3). By adjusting a size of the grooves 132 (sum of two places), to cause a contact area between the holder 110B and the heat exchanger plate 122 to have an appropriate value, the thermal resistance between the Peltier device 140 and the light-emitting element 11B can be adjusted.

That is, the grooves 131 and 132 function as thermal resistance adjustment parts, respectively. The thermal resistance adjustment part may be arranged between the Peltier device 140 and at least one of the light-emitting elements. In the example shown in FIG. 4, the thermal resistance adjustment part is not arranged between the Peltier device 140 and the light-emitting element 11R.

Meanwhile, the number of the grooves 131 and 132 may be changed appropriately. For example, the groove 132 may be provided in a place. Moreover, shapes of the grooves 131, 132 may be other than a quadrangle, and may be, for example, a circle, an oval, a polygon (other than quadrangle), or other complicated shapes.

In the case of FIG. 4, the abutting area (contact area) between the heat exchanger plate 121 and the holder 110R in which no groove is provided is the greatest, and the abutting area (contact area) between the heat exchanger plate 121 and the holder 110G is the second greatest. Then, the abutting area (contact area) between the heat exchanger plate 122 and the holder 110B is the smallest. In other words, the thermal resistance R between the heat exchanger plate 121 and the holder 110R is the smallest. The thermal resistance G between the heat exchanger plate 121 and the holder 110G is greater than the thermal resistance R. Then the thermal resistance B between the heat exchanger plate 122 and the holder 110B is further greater than the thermal resistance G.

Therefore, for example, in the case where the Peltier device 140 cools the respective light-emitting elements, if the amounts of heat generation from the respective light-emitting elements are the same, the temperature of the light-emitting element 11R is the lowest, and the temperature of the light-emitting element 11G is greater than the temperature of the light-emitting element 11R. Moreover, the temperature of the light-emitting element 11B is further greater than the temperature of the light-emitting element 11G.

For example, assuming a case where the external environment temperature is 85° C., the upper limit of the temperature range of operation for the light-emitting element 11R is 60° C., the upper limit of the temperature range of operation for the light-emitting element 11G is 70° C. and the upper limit of the temperature range of operation for the light-emitting element 11B is 80° C. In this case, required temperature control effort is the greatest for the light-emitting element 11R, the second greatest for the light-emitting element 11G, and the smallest for the light-emitting element 11B.

Here, a temperature sensor is arranged adjacent to the light-emitting element, the external environment temperature is detected to be 85° C. by the temperature sensor, and the temperature of the Peltier device 140 is controlled based on the detected temperature. Because the thermal resistance adjustment parts in accordance with the temperature control effort of the respective light-emitting elements is provided, the temperature of the light-emitting element 11R can be set to be less than or equal to 60° C. (e.g. 55° C.), the temperature of the light-emitting element 11G can be set to be less than or equal to 70° C. (e.g. 65° C.) and the temperature of the light-emitting element 11B can be set to be less than or equal to 80° C. (e.g. 75° C.). That is, by using the single Peltier device 140, the temperatures of the respective light-emitting elements can be controlled at different values in conformity with the temperature control effort required for the respective light-emitting elements.

In this case, if the grooves 131 and 132 are not provided, in the case where the external environment temperature is 85° C., for example, in conformity with the light-emitting element 11R having the smallest upper limit of the temperature range of operation, the temperatures of the respective light-emitting elements are required to be controlled to be less than or equal to 60° C. (e.g. 55° C.). There is not any problem in the above-described processing for the operation of the respective light-emitting elements. However, the light-emitting elements 11G and 11B are controlled excessively (controlled more than the required temperature control effort), and thereby the power consumption of the Peltier device 140 becomes greater.

In contrast, in the image display apparatus 1 according to the present embodiment, the grooves 131 and 132 are provided, the grooves 131 and 132 are designed to be appropriate sizes, and thereby the thermal resistances between the Peltier device 140 and the light-emitting elements 11R, 11G and 11B can be adjusted to appropriate values.

Therefore, it becomes possible to control temperatures of a plurality of light-emitting elements (the light-emitting elements 11R, 11G and 11B) by using a single Peltier device 140 in balance in conformity with temperature control effort required for the respective light-emitting elements, and thereby power consumption of the Peltier device 140 can be reduced. Moreover, the control is performed by using the single Peltier device 140, and thereby a size of the heat sink 150 can be reduced compared with the case using a plurality of the Peltier devices.

Meanwhile, in the present embodiment, a groove is provided in a heat exchanger plate. However, because the purpose of the groove is to adjust an abutting area (contact area) between a holder and the heat exchanger plate, a groove may be provided on a back surface of the holder instead of the heat exchanger plate. Moreover, instead of the groove, a through hole may be provided. Moreover, thermal resistance may be adjusted by controlling a surface roughness of a contact surface between the heat exchanger plate and the holder, instead of providing the groove. Moreover, a member having thermal conductivity less than those of the holder and the heat exchanger plate (resin sheet or the like) may be attached between the holder and the heat exchanger plate, to adjust the abutting area (contact area) between the holder and the heat exchanger plate. That is, the thermal resistance adjustment part may be not only a groove, but also a roughened surface, a through hole, a separated member or the like.

As described above, the temperature control device according to the present embodiment includes the light-emitting element 11R and the holder 110R, the light-emitting element 11G and the holder 110G, the light-emitting element 11B and the holder 110B, the heat exchanger plates 121 and 122, the Peltier device 140 (temperature control element), and the grooves 131 and 132 (thermal resistance adjustment part). The temperature control device is provided with the thermal resistance adjustment part in accordance with temperature control effort required for the respective light-emitting elements, and thereby the temperatures of the plurality of light-emitting elements, necessary temperature control effort of which is different from each other, can be controlled in balance by using the single temperature control element.

Laser diodes for different wavelengths can have temperature ranges of operation (heat resistance temperatures) or amounts of heat generation, which are different from each other. In this case, the temperatures of the respective laser diodes are preferably controlled with balance so as not to be controlled excessively depending on temperature control effort required for the respective laser diodes (amounts of heat absorption or amounts of heat generation required for the Peltier devices). In the technology disclosed in Japanese Unexamined Patent Application Publication No. 2014-195218, because the same number of Peltier devices (temperature control elements) as the plurality of laser diodes (light-emitting elements) are used in order to control with balance, not only a cost of the entire apparatus becomes higher but also it becomes a layout restriction.

According to the first embodiment, it is possible to control with balance temperatures of a plurality of light-emitting elements having necessary amounts of temperature control different from each other with a single temperature control element.

<First Variation of First Embodiment>

In a first variation of the first embodiment, a heat exchanger plate that is used for a plurality of light-emitting elements will be described. Meanwhile, in the first variation of the first embodiment, an explanation for the same component as in the embodiment that has already been explained may be omitted.

Figure 5:
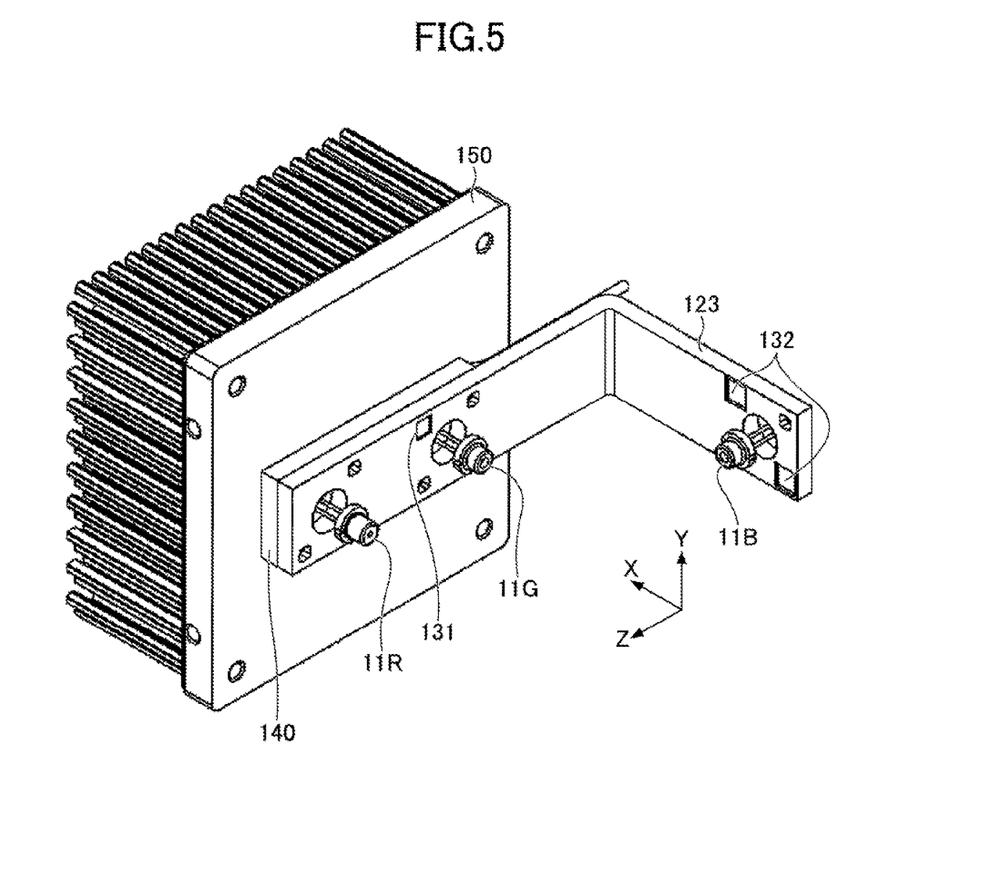
FIG. 5 is a perspective view illustrating an example of a structure adjacent to a heat exchanger plate according to a first variation of the first embodiment.

FIG. 5 is a perspective view illustrating a structure adjacent to a heat exchanger plate according to the first variation of the first embodiment. As shown in FIG. 5, on the back surfaces of the holders 110R, 110G and 110B (See FIGS. 2 and 3), an L-shaped heat exchanger plate 123 is fixed by a screw or the like. The heat exchanger plate 123 may be made of a material having great thermal conductivity, such as aluminum or copper. On a back surface of a long side of the L-shape of the heat exchanger plate 123, a Peltier device 140 that is a temperature control element is provided. Furthermore, on an opposite side of the Peltier device 140 to the heat exchanger plate 123, a heat sink 150 is provided.

The light-emitting element 11R can be heated or cooled by the Peltier device 140 via the holder 110R and the heat exchanger plate 123. Moreover, the light-emitting element 11G can be heated or cooled by the Peltier device 140 via the holder 110G and the heat exchanger plate 123. Moreover, the light-emitting element 11B can be heated or cooled by the Peltier device 140 via the holder 110B and the heat exchanger plate 123.

The heat exchanger plate 123 is provided with a groove 131 on a surface opposite to the holder 110G, and a groove 132 on a surface opposite to the holder 110B. Therefore, in the same way as in the first embodiment, by designing the grooves 131 and 132 having proper sizes, the thermal resistance between the Peltier device 140 and the light-emitting element 11B can be adjusted to an appropriate value.

Accordingly, it becomes possible to control temperatures of the plurality of light-emitting elements (the light-emitting elements 11R, 11G and 11B) by using a single Peltier device 140 in balance. By performing the temperature control using the single Peltier device 140, a power consumption can be reduced and a size of the heat sink 150 can be reduced compared with the case using the plurality of Peltier devices.

<Second Variation of First Embodiment>

In a second variation of the first embodiment, a heat exchanger plate in a case where a plurality of light-emitting elements (light-emitting elements 11R, 11G and 11B) are arranged in one direction will be described. Meanwhile, in the second variation of the first embodiment, an explanation for the same component as in the embodiment that has already been explained may be omitted.

Figure 6:
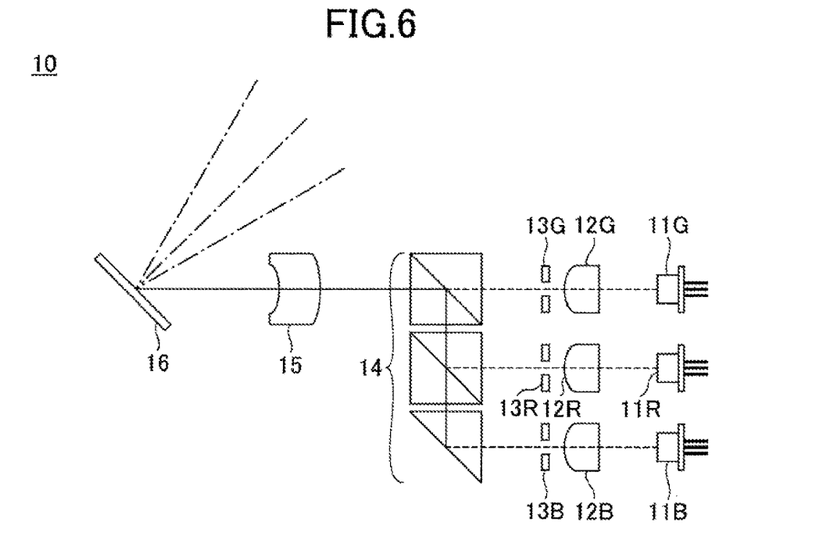
FIG. 6 is a diagram illustrating an example of a configuration of a light scanning unit according to a second variation of the first embodiment.

FIG. 6 is a diagram illustrating a light scanning unit according to the second variation of the first embodiment. Meanwhile, a positional relationship among a light deflector 16, a scanning mirror 20 and a surface to be scanned 30 is the same as in the case of FIG. 1.

As shown in FIG. 6, in the light scanning unit according to the second variation of the first embodiment, a set of the light-emitting element 11R, a coupling lens 12R and an aperture 13R, a set of the light-emitting element 11G, a coupling lens 12G and an aperture 13G and a set of the light-emitting element 11B, a coupling lens 12B and an aperture 13B are juxtaposed so that traveling directions of respective light fluxes are approximately parallel with each other.

The respective light fluxes formed in the apertures 13R, 13G and 13B enter a synthetic element 14 to be synthesized into a light path as a light flux, in the same way as in FIG. 1. Furthermore, an optical system following and including the synthetic element 14 is the same as in FIG. 1. Meanwhile, FIG. 6 illustrates using a dichroic mirror in a prism shape as the synthetic element 14.

Figure 7:
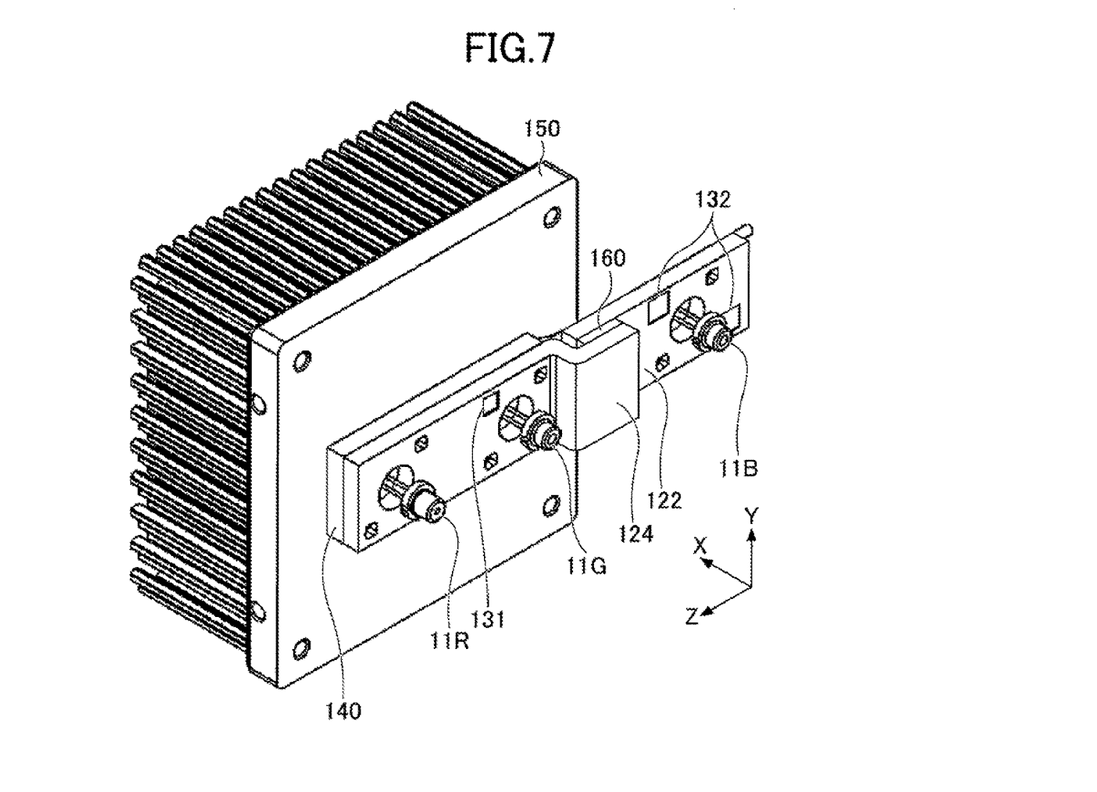
FIG. 7 is a perspective view illustrating a first example of a structure adjacent to a heat exchanger plate according to the second variation of the first embodiment.

FIG. 7 is a perspective view of a structure adjacent to the heat exchanger plate according to the second variation of the first embodiment. As shown in FIG. 7, on back surfaces of the holder 110R and 110G (See FIGS. 2 and 3), an I-shaped heat exchanger plate 124 is fixed by using a screw or the like. However, at one end portion of the heat exchanger plate 124 in the longitudinal direction (right end in the Z-direction in FIG. 7), a stepped part for fixing a heat exchange plate 122 is provided. The heat exchanger plate 124 may be made of a material having great thermal conductivity, such as aluminum or copper. On a back surface of the heat exchanger plate 124, a Peltier device 140 that is a temperature control element is provided. Furthermore, on an opposite side of the Peltier device 140 to the heat exchanger plate 124, a heat sink 150 is provided.

The light-emitting element 11R can be heated or cooled by the Peltier device 140 via the holder 110R and the heat exchanger plate 124. Moreover, the light-emitting element 11G can be heated or cooled by the Peltier device 140 via the holder 110G and the heat exchanger plate 124.

A facing surface of the I-shaped heat exchanger plate 122 comes in contact with a back surface of the holder 110B. Both members are fixed by using a screw or the like. An elastic member 160 having great heat conductivity is inserted between the heat exchanger plate 124 and the heat exchanger plate 122. That is, two heat exchanger plates, the heat exchanger plate 124 and the heat exchanger plate 122, are thermally coupled to each other via the elastic member 160, to form a single I-shaped heat exchanger plate as a whole. Meanwhile, the effect of inserting the elastic member 160 between the heat exchanger plate 124 and the heat exchanger plate 122 is the same as in the first embodiment.

The heat exchanger plate 124 is provided with a groove 131 on a surface opposite to the holder 110G, and a groove 132 on a surface opposite to the holder 110B. Therefore, in the same way as in the first embodiment, by designing the grooves 131 and 132 having proper sizes, the thermal resistances between the Peltier device 140 and the light-emitting elements 11R, 11G and 11B can be adjusted to appropriate values.

Accordingly, it becomes possible to control temperatures of a plurality of light-emitting elements (the light-emitting elements 11R, 11G and 11B) by using a single Peltier device 140 in balance. By performing the temperature control using the single Peltier device 140, a power consumption can be reduced and a size of the heat sink 150 can be reduced compared with the case using a plurality of the Peltier devices.

Figure 8:
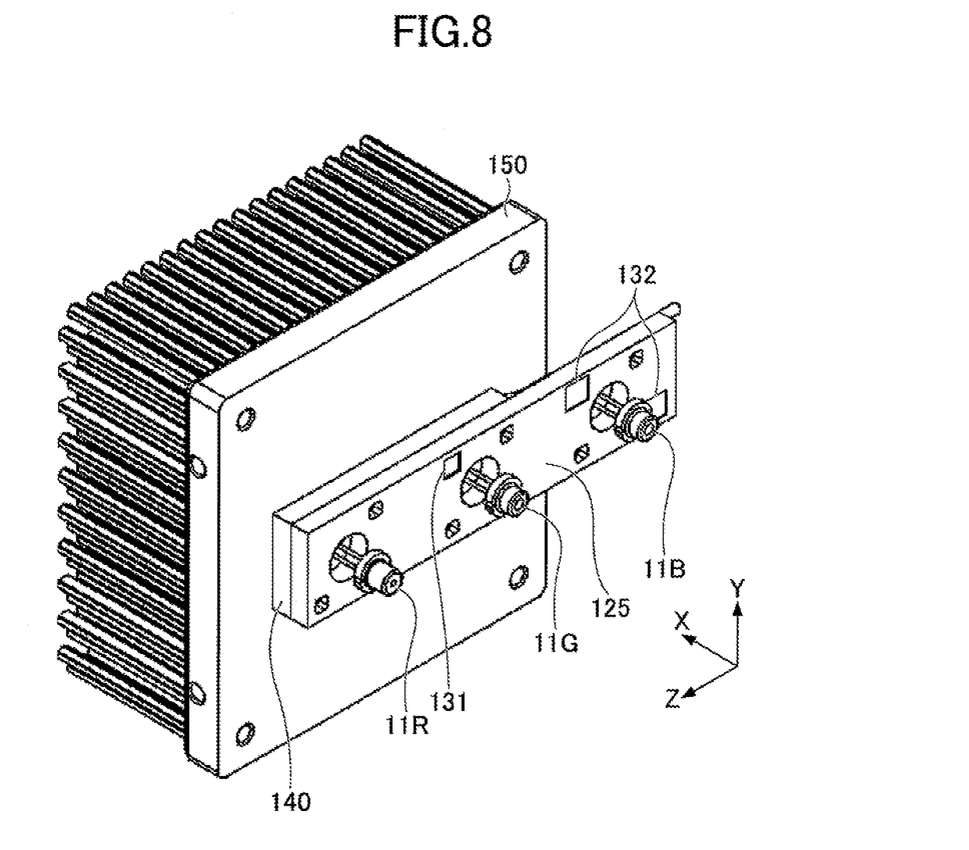
FIG. 8 is a perspective view illustrating a second example of the structure adjacent to the heat exchanger plate according to the second variation of the first embodiment.

Meanwhile, as shown in FIG. 8, a single I-shaped heat exchanger plate 125 may be used for a plurality of light-emitting elements (light-emitting elements 11R, 11G and 11B).

Further, the present invention is not limited to these embodiments, but various variations and modifications may be made without departing from the scope of the present invention.

For example, in the embodiments and variations, a Peltier device is used for a temperature control element. However, a temperature control element other than the Peltier device may be used. For example, in a case of only heating respective light-emitting elements without cooling, a heater element (e.g. a ceramic heater or the like) may be used for the temperature control element.

What is claimed is:

1. A temperature control device comprising:
    a first light source unit;
    a second light source unit, a temperature control effort for which is different from a temperature control effort for the first light source unit;
    a heat exchanger plate in contact with the first light source unit and the second light source unit;
    a single temperature control element configured to control temperature of the first light source unit and temperature of the second light source unit via the heat exchanger plate; and
    a thermal resistance adjustment part configured to adjust at least one of a value of a thermal resistance between the single temperature control element and the first light source unit and a value of a thermal resistance between the single temperature control element and the second light source unit,
    wherein said thermal resistance adjustment part includes an indentation in a planar surface of the heat exchanger plate, and the indentation causing a reduced contact area between the heat exchange plate and a corresponding light source unit amongst the first light source unit and the second light source unit, and wherein an expected amount of heat generation from the corresponding light source unit is relatively greater than that of the other of the first light source unit and the second light source.

2. The temperature control device according to claim 1, wherein the indentation of the thermal resistance adjustment part reduces the contact area between the corresponding light source unit and the heat exchanger plate and thereby correspondingly adjusts a value of the thermal resistance between the corresponding light source unit and the single temperature control element.

3. The temperature control device according to claim 1 further comprising
    a third light source unit,
    wherein the temperature control effort for the first light source unit is less than any of the temperature control effort for the second light source unit and a temperature control effort for the third light source unit, and
    wherein the value of the thermal resistance between the single temperature control element and the first light source unit is adjusted by the thermal resistance adjustment part to be greater than any of the value of the thermal resistance between the single temperature control element and the second light source unit and a value of a thermal resistance between the single temperature control element and the third light source unit.

4. The temperature control device according to claim 3, wherein the heat exchanger plate has a shape of a letter L,
    wherein the first light source unit is in contact with an inside of a short side of the letter L of the heat exchanger plate,
    wherein the second light source unit and the third light source unit are in contact with an inside of a long side of the letter L of the heat exchanger plate, and
    wherein the single temperature control element is in contact with an outside of the long side of the letter L of the heat exchanger plate.

5. The temperature control device according to claim 3,
    wherein the first light source unit is configured to emit light including a component with a wavelength of 445 nm,
    wherein the second light source unit is configured to emit light including a component with a wavelength of 530 nm, and
    wherein the third light source unit is configured to emit light including a component with a wavelength of 640 nm.

6. The temperature control device according to claim 1, wherein the heat exchanger plate includes a first heat exchanger plate in contact with a light source unit amongst the first and second light source units; and a second heat exchanger plate in contact with the other of the first and second light source units which is other than the light source unit with which the first heat exchanger plate is in contact, and wherein the first heat exchanger plate and the second heat exchanger plate are thermally coupled to each other via an elastic member.

7. An image display apparatus including the temperature control device according to claim 1.

8. The image display apparatus according to claim 7 further comprising:

a light deflector configured to deflect a light flux into which light fluxes emitted from the first and second light source units are synthesized, and form a two-dimensional image on a surface to be scanned;

a semi-transmissive mirror configured to transmit a part of visible light and reflect another part of the visible light on a reflection surface; and a projection optical system configured to project the two-dimensional image onto the reflection surface of the semi-transmissive mirror.

9. The image display apparatus according to claim 8, wherein an enlarged virtual image of the two-dimensional image is formed at a predetermined position on a surface opposed to the reflection surface of the semi-transmissive mirror.

10. A vehicle, in which the image display apparatus according to claim 8 is installed, wherein an enlarged virtual image of the two-dimensional image, which is viewable by a driver, is formed at a predetermined position beyond the reflection surface of the semi-transmissive mirror.

11. A temperature control device comprising:

a first light source unit;

a second light source unit, a temperature control effort for which is different from a temperature control effort for the first light source unit;

a heat exchanger plate in contact with the first light source unit and the second light source unit;

a single temperature control element configured to control temperature of the first light source unit and temperature of the second light source unit via the heat exchanger plate; and a thermal resistance adjustment part configured to adjust at least one of a value of a thermal resistance between the single temperature control element and the first light source unit and a value of a thermal resistance between the single temperature control element and the second light source unit, wherein said thermal resistance adjustment part includes a through hole disposed in the heat exchanger plate, and the through hole causing a reduced contact area between the heat exchange plate and a corresponding light source unit amongst the first light source unit and the second light source unit, and wherein an expected amount of heat generation from the corresponding light source unit is relatively greater than that of the other of the first light source unit and the second light source.

12. The temperature control device according to claim 11, wherein the heat exchanger plate has a shape of a letter L, wherein the first light source unit is in contact with an inside of a short side of the letter L of the heat exchanger plate, wherein the second light source unit is in contact with an inside of a long side of the letter L of the heat exchanger plate, and wherein the single temperature control element is in contact with an outside of the long side of the letter L of the heat exchanger plate.

13. The temperature control device according to claim 11, wherein the heat exchanger plate includes a first heat exchanger plate in contact with a light source unit amongst the first and second light source units; and a second heat exchanger plate in contact with the other of the first and second light source units which is other than the light source unit with which the first heat exchanger plate is in contact, and wherein the first heat exchanger plate and the second heat exchanger plate are thermally coupled to each other via an elastic member.

14. An image display apparatus comprising:

the temperature control device according to claim 11;

a light deflector configured to deflect a light flux into which light fluxes emitted from the first and second light source units are synthesized, and form a two-dimensional image on a surface to be scanned;

a semi-transmissive mirror configured to transmit a part of visible light and reflect another part of the visible light on a reflection surface; and a projection optical system configured to project the two-dimensional image onto the reflection surface of the semi-transmissive mirror.

15. A vehicle, in which the image display apparatus according to claim 14 is installed, wherein an enlarged virtual image of the two-dimensional image, which is viewable by a driver, is formed at a predetermined position beyond the reflection surface of the semi-transmissive mirror.

16. A temperature control device comprising:

a first light source unit;

a second light source unit, a temperature control effort for which is different from a temperature control effort for the first light source unit;

a heat exchanger plate in contact with the first light source unit and the second light source unit;

a single temperature control element configured to control temperature of the first light source unit and temperature of the second light source unit via the heat exchanger plate; and a thermal resistance adjustment part configured to adjust at least one of a value of a thermal resistance between the single temperature control element and the first light source unit and a value of a thermal resistance between the single temperature control element and the second light source unit, wherein said thermal resistance adjustment part includes a contact surface including surface roughness, on the heat exchanger plate, and the surface roughness causing a reduced contact area between the heat exchange plate and a corresponding light source unit amongst the first light source unit and the second light source unit, and wherein an expected amount of heat generation from the corresponding light source unit is relatively greater than that of the other of the first light source unit and the second light source.

17. The temperature control device according to claim 16, wherein the heat exchanger plate has a shape of a letter L, wherein the first light source unit is in contact with an inside of a short side of the letter L of the heat exchanger plate, wherein the second light source unit is in contact with an inside of a long side of the letter L of the heat exchanger plate, and wherein the single temperature control element is in contact with an outside of the long side of the letter L of the heat exchanger plate.

18. The temperature control device according to claim 16, wherein the heat exchanger plate includes
- a first heat exchanger plate in contact with a light source unit amongst the first and second light source units; and
- a second heat exchanger plate in contact with the other of the first and second light source units which is other than the light source unit with which the first heat exchanger plate is in contact, and wherein the first heat exchanger plate and the second heat exchanger plate are thermally coupled to each other via an elastic member.

19. An image display apparatus comprising:

the temperature control device according to claim 16;

a light deflector configured to deflect a light flux into which light fluxes emitted from the first and second light source units are synthesized, and form a two-dimensional image on a surface to be scanned;

a semi-transmissive mirror configured to transmit a part of visible light and reflect another part of the visible light on a reflection surface; and a projection optical system configured to project the two-dimensional image onto the reflection surface of the semi-transmissive mirror.

20. A vehicle, in which the image display apparatus according to claim 19 is installed, wherein an enlarged virtual image of the two-dimensional image, which is viewable by a driver, is formed at a predetermined position beyond the reflection surface of the semi-transmissive mirror.

* * * * *